United States Patent [19]

Mahnke et al.

[11] 4,298,864
[45] Nov. 3, 1981

[54] POWER LINE FAULT DETECTOR CIRCUIT

[75] Inventors: Earl A. Mahnke, Eastlake; Christopher J. Zoller, Painesville, both of Ohio

[73] Assignee: The Ericson Manufacturing Company, Willoughby, Ohio

[21] Appl. No.: 103,460

[22] Filed: Dec. 14, 1979

[51] Int. Cl.³ .................. G08B 21/00; H02H 3/16
[52] U.S. Cl. .................. 340/657; 340/649; 361/56
[58] Field of Search .......... 340/649, 650, 651, 639, 340/657; 361/56, 55, 54, 91, 111, 110, 46, 50; 324/51 (U.S. only)

[56] References Cited

U.S. PATENT DOCUMENTS

| 2,449,150 | 9/1948 | Schnoll | 340/656 |
|---|---|---|---|
| 2,731,629 | 1/1956 | Siderman | 340/654 |
| 2,774,960 | 12/1956 | Podell | 340/639 |
| 2,997,701 | 8/1961 | Costanzo | 340/649 |
| 3,136,920 | 6/1964 | Jensen | 340/654 |
| 3,171,113 | 2/1965 | McNamara | 340/649 |
| 3,258,635 | 6/1966 | Carothers et al. | 313/231 |
| 3,383,588 | 5/1968 | Stoll et al. | 324/51 |
| 3,558,995 | 1/1971 | Swinehart | 307/305 |
| 3,588,891 | 6/1971 | Lester | 340/650 X |
| 3,659,152 | 4/1972 | De Langis | 340/649 X |
| 3,753,261 | 8/1973 | Thaxton | 340/649 |
| 3,873,951 | 3/1975 | Blake | 335/164 |
| 3,890,030 | 6/1975 | McDaniel | 339/113 L |
| 3,924,914 | 12/1975 | Banner | 339/14 P |
| 3,944,891 | 3/1976 | McDonald et al. | 361/77 |
| 4,166,242 | 8/1979 | Spiteri | 324/51 |

OTHER PUBLICATIONS

Woodhead "Ground Continuity Monitor", Circuit Schematic & Ad. Literature.

Primary Examiner—John W. Caldwell, Sr.
Assistant Examiner—Daniel Myer
Attorney, Agent, or Firm—Yount & Tarolli

[57] ABSTRACT

A power line fault detector (10) includes a capacitive impedance (12) and another impedance (14) connected in series between the hot and ground conductors of the power line, with a trigger circuit (16) being connected between the neutral conductor of the power line and the junction of the impedances. The impedances have values selected such that the voltage at the junction thereof with respect to the neutral conductor does not exceed a preselected limit unless the power line is faultily connected. The trigger circuit normally has a high impedance but switches to a low impedance when the voltage across it exceeds the preselected limit, then producing a surge of capacitive impedance charging current. A sensing circuit (20, 21, 26) senses the surges of current in the trigger circuit and provides an indication to the operator that the power line is faulted.

12 Claims, 3 Drawing Figures

POWER LINE FAULT DETECTOR CIRCUIT

BACKGROUND AND FIELD OF THE INVENTION

The present invention relates to power line fault detector circuits.

Three conductor power lines such as used in home wiring and in many industrial applications include "hot" and "neutral" lines, across which approximately 120 VAC is applied, and a third, "ground" line. Both the neutral and ground lines are connected to earth ground. The ground line is essentially a duplicate of the neutral line and is provided for safety purposes; it will normally carry no current.

This ground line will be connected to the chassis of the powered equipment or any other metallic parts which are exposed to possible contact by the operator. Then, in the event of an internal short within the mechanism, the short will be shielded from the operator by the grounded chassis. It is therefore important for safety reasons that this ground line not become accidentally disconnected from earth ground. In the event that it is disconnected, the operation of electrical devices from that power line becomes unsafe and should be discontinued until the ground line is repaired.

In the past, certain electrical apparatus known as ground or power line fault detector circuits were provided for connection to the power lines to sense whether or not the ground was continuous. In its simplest form, this ground fault detector took the form of simply a resistor and a neon light interconected in series across the hot and ground lines. If the hot and ground lines were properly connected, then the neon light would glow. If the ground line was discontinuous, however, then the neon light would not glow. This approach was somewhat disadvantageous, however, in that the neon light would also glow if the hot and ground lines were interchanged; a very dangerous condition, indeed.

Another approach was to intereconnect series connected combinations of resistors and neon lights between each different pair of conductors (i.e., hot-neutral, neutral-ground, ground-hot). By examining the combination of lights that were illuminated, one could determine whether or not the power line was properly connected. This approach was not, however, convenient to utilize in industrial applications, since it required that the operator both examine the lights and know the proper combination of lights in order to determine whether or not the circuit was properly connected. These devices are designed for intermittent use as stand-alone testers, and are adapted for connection to the power line in place of the appliance connection when the power line is to be tested for integrity.

BRIEF SUMMARY OF THE INVENTION

The present invention provides a circuit interconnectable with a power line and designed to provide a single go/no-go indication, indicating at a single glance whether the ground line is connected and whether the hot and neutral or hot and ground lines have been interchanged.

To achieve this, a circuit is provied consisting of at least first and second impedance components connected in series across the hot and ground lines, with the voltage at the junction of the components being dependent upon the condition of the ground line. A circuit is also provided for detecting the voltage between the junction and neutral lines and for providing a go/no-go indication whenever this voltage exceeds a preselected limit.

In the disclosed embodiment, these two elements consist of a capacitor connected to the hot line, and interconnected in series with a resistor to the ground line. The junction between the capacitor and the resistor is connected to the neutral line through a negative resistance, avalanche-type device such as a trigger diode. This device will "break over" if the voltage at the junction between the capacitor and the resistor exceeds a preselected level, present only when the ground line is interrupted or hot is interchanged with either of the neutral or ground lines. The current path through the negative resistance device passes through the gate current path of a thyristor, wherein the indication means is controlled by the thyristor. Thus, whenever the negative resistance device breaks over, a surge of gate current is supplied to the thyristor, placing it in a low impedance condition and thus changing the state of the indication means.

BRIEF DESCRIPTION OF THE DRAWINGS

The foregoing and other objects and advantages of the present invention will become more readily apparent from the following detailed description, as taken in conjunction with the accompanying drawings, wherein.

DETAILED DESCRIPTION

Figure 1:
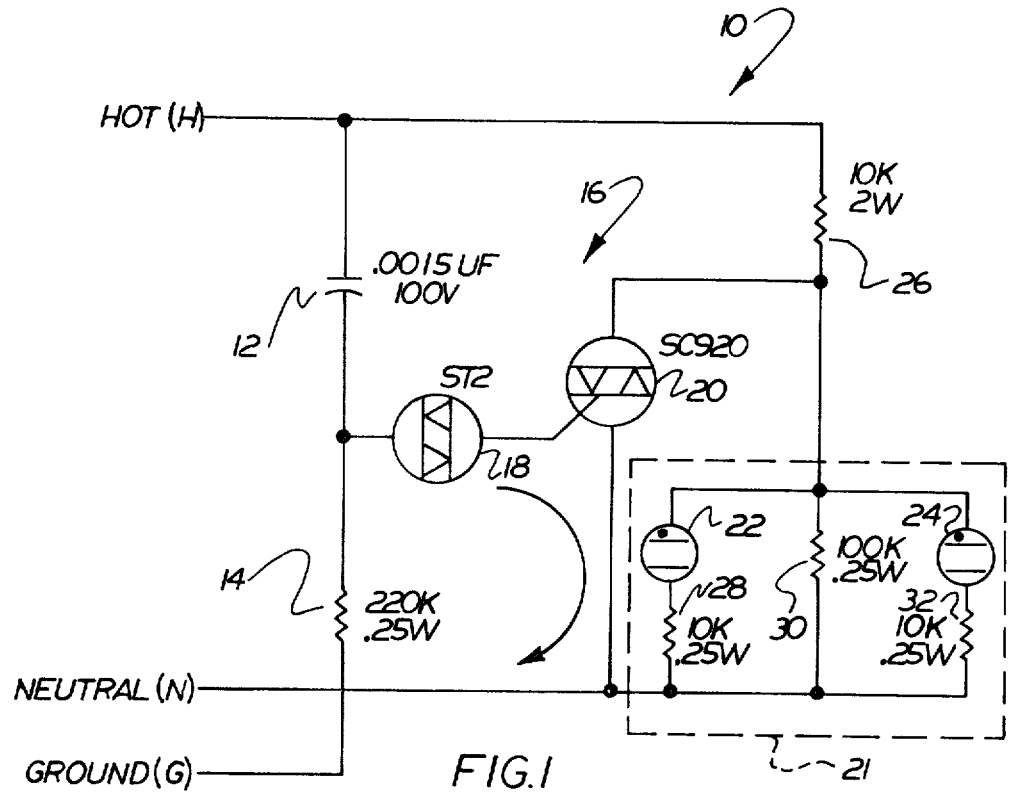
FIG. 1 is a schematic diagram of one embodiment of a ground fault detector circuit in accordance with the teachings of the present invention.

Illustrated in FIG. 1 is one embodiment of a ground fault detector circuit in accordance with the teachings of the present invention. It will be appreciated, of course, that the ground fault detector circuit can take many other forms, as will become readily apparent in the following description.

As can be seen in FIG. 1, the ground fault detector circuit has three input terminals: hot (H), neutral (N) and ground (G) for connection to the corresponding conductors of the power line. Interconnected in series between the hot and ground lines are a capacitor 12 and a resistor 14 which together represent a reactive attenuator circuit. The amount of attenuation of the power signal at the junction of these two components is dependent upon the continuity of the ground line. A sensing circuit, generally indicated at 16, is interconnected between the neutral line and the junction of capacitor 12 and resistor 14.

More specifically, the resistor 14 has a low enough value that the charging current for capacitor 12 does not produce a voltage drop across resistor 14 which exceeds a certain preselected magnitude. Thus, as long as the ground line is properly connected, the voltage signal at the junction between resistor 14 and capacitor 12 will be below this limit.

In the event that the ground line is interrupted, however, essentially no charging current will pass through resistor 14. Furthermore any residual charge on the capacitor will dissipate through the inherent leakage resistance of the capacitor. Consequently, the voltage at the junction of capacitor 12 and resistor 14 will follow the power line voltage, thus being of much greater value than if the ground line were properly connected.

The circuit 16 essentially detects whether or not the voltage at the junction of capacitor 12 and resistor 14 has exceeded the preselected limit, when measured with reference to the neutral line. This circuit 16 includes a negative resistance trigger diode element 18 and the gate current path of a thyristor 20.

In analyzing the operation of this circuit, the trigger diode 18 may be considered to be connected directly between the neutral line N and the junction of capacitor 12 and resistor 14, since the gate current path of the thyristor 20 has only a small voltage drop thereacross.

The trigger diode 18 will have a very high impedance as long as the voltage drop across it does not exceed a given threshold or trigger voltage $V_t$. If the voltage across the trigger diode exceeds this trigger voltage, however, then the trigger diode will abruptly shift to a very low impedance condition, and the voltage across it will drop back to a voltage which is substantially lower.

In the circuit of FIG. 1, the size of the capacitor 12 and the resistor 14 are selected such that the voltage at the junction of these two components does not normally exceed the trigger voltage of the trigger diode 18. Consequently, the trigger diode 18 will remain in a high impedance state and essentially no current will flow through the gate current path of the thyristor 20. The thyristor 20 will therefore remain in an "off" condition as long as the ground line is properly connected. In the event that the ground line becomes open, however, the voltage at the junction of capacitor 12 and resistor 14 will, in each cycle of the AC line voltage, increase until reaching the trigger voltage of the trigger diode 18, at which point the trigger diode will drop back to its holding voltage. This will cause a surge of capacitor charging current through the trigger diode 18 and thus through the gate current path of the thyristor 20, turning it "on". Consequently, when the ground line is open, the thyristor 20 will be in an "on" condition.

It will also be noted that the thyristor 20 will be switched on whenever the hot line is interchanged with either of the neutral or ground lines. Thus, if the hot line is interchanged with either of the neutral or ground lines, the line voltage will essentially be applied across the series combination of the resistor 14, trigger diode 18 and the gate current path of the thyristor 20. As before, in each cycle of the power line voltage the voltage across the diode 18 will increase until the threshold voltage of trigger diode 18 is exceeded, at which point the trigger diode will break back to the holding voltage, again producing the surge of gate current which triggers the thyristor 20 to the "on" condition.

In FIG. 1, the load which is controlled by the thyristor 20 comprises a resistor 26 and a neon lamp circuit 21. The neon lamp circuit includes two neon lamps 22 and 24 interconnected in a network with resistors 28, 30 and 32. As can be seen in FIG. 1, each of the two neon lamps 22 and 24 is interconnected in series with its own corresponding resistor 28 and 32 and in parallel to one another. The purpose of the resistors 28 and 32 is to insure that both neon lamps are illuminated, even though one might have a lower threshold voltage than the other. Thus, were these resistors not included, the one of the two neon lamps 22 and 24 which had a lower threshold voltage would trigger first, dropping the voltage across the other neon lamp and preventing it from triggering. The resistors 28 and 32, however, have a sufficient voltage drop thereacross that, even if the associated neon lamp is conducting, the total voltage drop across the series combination of the neon lamp and its associated series resistor exceeds the largest expected threshold voltage for the other neon lamp. Consequently, as long as the voltage across the parallel combination of the neon lamps 22 and 24 exceeds this largest threshold voltage, both of the neon lamps will be illuminated.

The neon lamp circuit 21 is interconnected in series with a resistor 26 across the hot and neutral lines. The thyristor 20, which is in this case a triac, is also connected across the neon lamp circuit 21, and controls the level of voltage provided thereto. As long as the thyristor 20 is "off" (power line O.K.), sufficient voltage will be developed across the neon lamps that they will become illuminated. When the thyristor 20 is "on" (power line faulty), however, the voltage across it will be quite low, significantly below the triggering voltage of the two neon lamps. The neon lamps will therefore remain dark. The condition of the lamps thus provides a visual indication of the status of the power line. The lamps will, of course, be located so as to be visible to the operator.

It will be appreciated that the resistor 26 provides holding current to the thyristor 20 when it is in the "on" condition. The resistor 26 must be selected so that, when thyristor 20 is "on," the level of current therethrough will hold the thyristor 20 "on" during the portion of the power cycle following the surge of gate control current produced by the triggering of diode 18.

The resistor 30 is included to bleed current past the neon lamps 22 and 24 to prevent the lamps from glowing when the neutral conductor is open. Otherwise leakage between the ground and hot conductors (through the gate of thyristor 20 to the neutral conductor and then through the neon lamps to the hot conductor) would cause the neon lamps 20 and 22 to glow dimly.

Several other aspects of the circuitry which has thus been described should be noted. Firstly, it will be appreciated that since a bidirectional thyristor (i.e., a triac) is utilized as the switching element 20, the voltage applied to the neon lamps 22 and 24 need not be rectified in any manner. Consequently, these lamps are energized by AC voltage, producing energization of both electrodes thereon. This prolongs their useful life as compared to lamps having only one electrode energized. In addition, during normal operation the thyristor 20 will be in an "off" condition with essentially no current flowing through either the gate control current path or the primary current path. Any degradation in the operation of the thyristor 20 due to such current is thereby avoided. Another aspect of the illustrated and described circuitry is that the operation thereof is insensitive to human touch of the ground line G. Moreover, it has been found that extremely low levels of current are provided on the ground line G by the reactive attenuator circuit comprised of capacitor 12 and resistor 14. This is always a desirable characteristic.

Of course, as stated previously, many variations may be made of the circuitry of FIG. 1 while still maintaining the spirit of the present invention. Thus, different reactive attenuator circuits could be employed other than the one specifically illustrated. Moreover, a different trigger element could be used in place of the trigger diode 18 illustrated. Similarly, another type of switching element could be used in place of the triac 20 illustrated, in certain circumstance.

Figure 3:
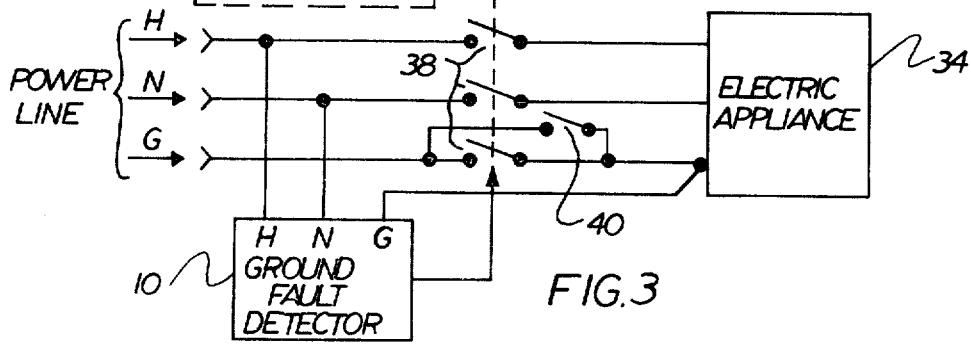
FIG. 3 is a broad block diagram illustrating another fashion of which the ground fault detector of FIG. 1 can be interconnected with an electric appliance and the power line.

Furthermore, the indicator means, although illustrated in FIG. 1 as comprising the neon lamp circuit 21, may of course take many alterntive forms. Thus, the neon lamp circuit 21 may be replaced by the coil of a relay having normally-open 3PST contacts. The hot, neutral, and ground lines could then be routed through these contacts to the appliance so that, in the event of a ground fault, power to the appliance would be automaticaly interrupted. This is shown in FIG. 3. Another approach would be to simply eliminate the network 21 and to replace the resistor 26 by an indicating means such as an audible alarm. In this event, the switching element 20 should be selected to have a rating adequate to have full line voltage applied thereacross, since the maximum voltage across the switching element would not be limited by the resistor 30.

Figure 2:
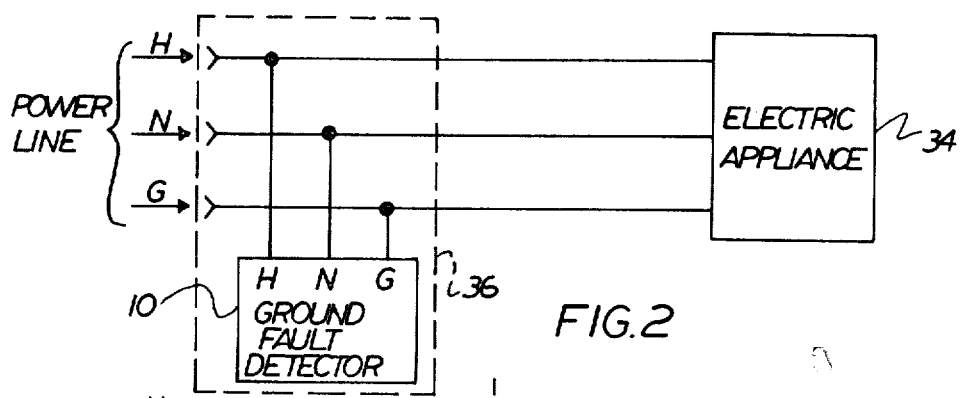
FIG. 2 is a broad block diagram of one fashion which the ground fault detector circuit of FIG. 1 can be interconnected with an electric appliance and a power line.

FIG. 3 illustrates one fashion in which the ground fault detector in accordance with the teachings of the present invention could be interconnected with a power line and an electrical appliance. In this Figure, the power line is shown as having the ground fault detector 10 and electrical appliance 34 both connected in parallel across the power lines. Although this ground fault detector could be constructed to be an integral part of the electrical appliance 34, in FIG. 2 the ground fault detector is illustrated as being an integral part of a connector 36 which connects the electric appliance 34 to the power line. Also, the connector 36 could be either male or female, it could be part of a wall jack or provided on either end or both ends of an extension cord, or be integrally constructed with the power line interconnected with the electric appliance 34, itself. In any event, the lamps 22 and 24 should be visible to the operator to provide a continuous indication of the condition of the power line.

FIG. 3 illustrates another fashion in which the ground fault detector 10 could be interconnected with the power line and the electric appliance 34. In this Figure, the ground line provided to the ground fault detector 10 is not taken directly from the power line, itself, but is rather returned from the electric appliance 34. Because of this, any fault in the ground line up to and including its connection to the chassis of the electrical appliance 34 will be sensed by the ground fault detector. In the connection illustrated in FIG. 2, on the other hand, faults in the ground line beyond the interconnection of the ground fault detector to the ground line will be undetectable. Also shown in FIG. 3 is the fashion in which the contacts of a relay could be interconnected in series with the power lines to the electrical appliance 34 so as to provide automatic interruption of the power provided to the electrical appliance in the event of a ground fault.

Since, in this embodiment, the ground line is also interrupted by the opening of the relay, the power to the electrical appliance 34 will remain interrupted for even brief faults in the ground line. Once the fault has been corrected, power can be restored to the electrical appliance 34 by bypassing the contact associated with the ground line by means of a manual pushbutton 40.

Although the invention has been described with respect to a preferred embodiment, it will be appreciated that various rearrangements and alterations of parts may be made without departing from the spirit and scope of the present, as defined in the appended claims.

What is claimed is:

1. Apparatus for connection to the hot, neutral and ground conductors of a power line for detecting faulty power line connections and providing an indication thereof, comprising:

first and second impedances connected in series between said hot and ground conductors, said first impedance being capacitive and connected to said hot conductor, and the values of said impedances being selected so that the voltage at the junction thereof does not exceed a preselected limit with respect to said neutral conductor unless said power line is faulted, trigger means connected betwen said neutral conductor and said junction for determining when the voltage therebetween has exceeded said preselected limit, said trigger means switching from a high impedance to a low impedance when said limit is exceeded, whereby a surge of current passes through said trigger means whenever said limit is exceeded, and, means for detecting said surges of current for then indicating that said power line is faulted.

2. Apparatus as set forth in claim 1, wherein said trigger means comprises a bidirectional trigger diode.

3. Apparatus as set forth in claim 1 wherein said detecting means comprises a thyristor having its gate current path connected in series with said trigger means between said neutral conductor and said junction, whereby said current surge also passes through said gate current path of said thyristor, causing the primary current path of said thyristor to switch from a high impedance to a low impedance, and indication means connected to said thyristor main current path and responsive to the switching thereof for then indicating that said power line is faulted.

4. Apparatus as set forth in claim 3 wherein said primary current path of said thyristor passes from a terminal on said thyristor, and through said thyristor to said neutral conductor, and wherein said indication mean comprises an impedance element connected between said hot conductor and said terminal, and a visual indicator connected between said terminal and said neutral conductor.

5. Apparatus as set forth in claim 4, wherein said visual indicator comprises at least two parallel connected neon lamp circuits, each including a neon lamp connected in series with an impedance, said impedances being selected to be great enough that the voltage across said indicator means may exceed the threshold voltage of all said lamps even after said lamps have become illuminated.

6. Apparatus as set forth in claim 1, wherein said power line is connected to an appliance, and wherein means are provided for interconnecting the ground connections of said impedances to the ground conductor of said power line through the ground connection of said power line to said appliance, whereby faults in the ground conductor up to and including the connection to said appliance are detected and indicated by said apparatus.

7. Apparatus as set forth in claim 1, wherein said power line is connected to an appliance and wherein said means for detecting and indicating includes means for interrupting the supply of power to said appliance from said power line upon detecting said surges of current.

8. A power line fault detector for detecting faults in a power line including at least hot, neutral and ground conductors comprising a capacitive impedance and another impedance connected in series between said hot and ground conductors, a thyristor having first, second and third terminals, a gate current path defind between said first and second terminals and a primary current path defined between said third and second terminals, said second terminal being connected to said neutral conductor and said first terminal being conncted to the junction of said impedances through a trigger diode whereby gate current will be supplied to said thyristor when said diode is triggered, said impedances being selected so that the voltage at said junction will exceed the trigger voltage of said trigger diode only when said power line is faulted, and indicator means connected between said third terminal and at least one of said hot and neutral conductors and controlled by said thyristor for indicating whether said power line is faulted.

9. A power line fault detector as set forth in claim 8, wherein said indicator means comprises a third impedance connected between said hot conductor and said third terminal, and means connected between said third terminal and said neutral conductor for indicating, when powered, that said power line is not faulted, said thyristor shunting power around said connected means when supplied with gate current as a result of a fault in said power line.

10. A power line fault detector as set forth in claim 9, wherein said means connected between said third terminal and said neutral conductor comprises at least one neon lamp for providing a visual indication of the condition of said power line.

11. A power line fault detector as set forth in claim 9 wherein said means connected between said third terminal and said neutral conductor comprises means for, when powered, causing said power line to be connected to an appliance and, when not powered, for causing said power line to be disconnected from said appliance.

12. A power line fault detector as set forth in claim 9, wherein both said trigger diode and thyristor are bidirectional elements whereby AC power can be provided to or shunted past said means connected between said third terminal and said neutral conductor from said power line.

* * * * *